(12) United States Patent
Tu et al.

(10) Patent No.: US 10,019,956 B2
(45) Date of Patent: Jul. 10, 2018

(54) SHIFT REGISTER

(71) Applicant: AU OPTRONICS CORPORATION, Hsin-chu (TW)

(72) Inventors: Chun-Da Tu, Hsin-chu (TW);
Yung-Chih Chen, Hsin-chu (TW);
Cheng-Han Huang, Hsin-chu (TW);
Kai-Wei Hong, Hsin-chu (TW);
Hsiang-Sheng Chang, Hsin-chu (TW);
Chuang-Cheng Yang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 178 days.

(21) Appl. No.: 15/139,827

(22) Filed: Apr. 27, 2016

(65) Prior Publication Data
US 2017/0124971 A1 May 4, 2017

(30) Foreign Application Priority Data

Oct. 29, 2015 (TW) .............................. 104135672 A

(51) Int. Cl.
*G11C 19/00* (2006.01)
*G09G 3/36* (2006.01)
*G11C 19/28* (2006.01)

(52) U.S. Cl.
CPC ......... *G09G 3/3648* (2013.01); *G09G 3/3677* (2013.01); *G11C 19/28* (2013.01); *G09G 2300/0408* (2013.01); *G09G 2310/0286* (2013.01); *G09G 2310/08* (2013.01); *G09G 2320/0214* (2013.01)

(58) Field of Classification Search
None
See application file for complete search history.

(56) References Cited

U.S. PATENT DOCUMENTS

| 7,310,402 | B2 |  | 12/2007 | Wei et al. | |
|---|---|---|---|---|---|
| 8,396,183 | B2 | * | 3/2013 | Yang | G09G 3/20 377/64 |
| 8,552,961 | B2 | * | 10/2013 | Yang | G11C 19/184 345/100 |
| 8,971,479 | B2 | * | 3/2015 | Chang | G09G 3/3655 377/64 |
| 9,424,949 | B2 | * | 8/2016 | Hong | G11C 19/28 |
| 9,626,890 | B2 | * | 4/2017 | Lin | G09G 3/20 |

(Continued)

FOREIGN PATENT DOCUMENTS

TW      201225532 A      6/2012

*Primary Examiner* — Tuan T Lam
(74) *Attorney, Agent, or Firm* — Tim Tingkang Xia, Esq.; Locke Lord LLP

(57) ABSTRACT

A shift register including a voltage set unit, a driver unit, a control unit, a first transistor, a second transistor, a third transistor and a fourth transistor is provided. The voltage set unit provides a terminal voltage. The driver unit provides a main gate signal according to the terminal voltage and a clock signal. The control unit provides a control signal. The first transistor receives the terminal voltage, a level reference voltage and the control signal. The second transistor is coupled to the first transistor and receives a low voltage and the control signal. The third transistor receives the terminal voltage, a level reference voltage and a gate reference signal. The fourth transistor is coupled to the third transistor and receives the low voltage and the gate reference signal.

17 Claims, 4 Drawing Sheets

(56) References Cited

U.S. PATENT DOCUMENTS

| | | | |
|---|---|---|---|
| 2004/0227718 A1 | 11/2004 | Park | |
| 2009/0304138 A1* | 12/2009 | Tsai | G11C 19/28 377/79 |
| 2010/0226473 A1* | 9/2010 | Liu | G11C 19/28 377/79 |
| 2014/0105351 A1* | 4/2014 | Chan | G11C 19/184 377/64 |
| 2014/0355732 A1* | 12/2014 | Lin | G06F 3/041 377/64 |
| 2015/0255034 A1* | 9/2015 | Hong | G09G 3/3674 345/214 |
| 2016/0267864 A1* | 9/2016 | Xiao | G09G 3/3677 |
| 2016/0343322 A1* | 11/2016 | Xiao | H01L 27/1255 |
| 2017/0092375 A1* | 3/2017 | Xia | G09G 3/3674 |

\* cited by examiner

SHIFT REGISTER

CROSS-REFERENCE TO RELATED APPLICATIONS

This application claims the priority to and the benefit of, pursuant to 35 U.S.C. § 119(a), Taiwanese Patent Application No. 104135672, filed Oct. 29, 2015, the content of which is incorporated herein in its entirety by reference.

TECHNICAL FIELD

The present invention relates generally to a shift register, and particularly to a shift register arranged at a display panel.

BACKGROUND

With the development of semiconductors in recent years, portable electronics and flat-panel displays have emerged as well. Among the various types of flat-panel displays, the Liquid Crystal Display (LCD) has become mainstream for its low operation voltage, absence of radiation scattering, light weight and small volume. This is why every factory focuses on developing LCD with smaller size and lower cost.

To lower the manufacturing cost of LCD, the shift register may be transferred from inside the gate driver onto the glass substrate of the LCD panel. A scanning signal (e.g. main gate signal or secondary gate signal) is outputted during operation of the shift register to activate a corresponding row of pixels in the LCD panel. Typically, the shift register manufactured on the glass substrates is made of a number of thin film transistors (TFTs). Due to the restrictions of manufacturing process, the electric property of the thin film transistor may cause the driving ability of the shift register to be insufficient. Therefore, finding a way to enable the shift register made of thin film transistors to work properly has become an important topic in the design of shift registers.

SUMMARY OF THE INVENTION

One aspect of the present invention provides a shift register, which lowers the leakage current of thin film transistors.

In certain embodiments of the present invention, the shift register includes a voltage setting unit, a drive unit, a first control unit, a first transistor, a second transistor, a third transistor and a fourth transistor. The voltage setting unit receives a first gate reference signal, so as to provide a terminal voltage. The drive unit receives the terminal voltage and a clock signal, so as to provide a main gate signal according to the terminal voltage and the clock signal. The first control unit receives a first latch reference signal, the terminal voltage and a first low voltage, so as to provide a first control signal. The first transistor has a first end for receiving the terminal voltage, a second end for receiving a level reference signal, and a control end for receiving the first control signal. The second transistor has a first end coupled to the second end of the first transistor, a second end for receiving a second low voltage, and a control end for receiving the first control signal. The third transistor has a first end for receiving the terminal voltage, a second end for receiving the level reference signal, and a control end for receiving a second gate reference signal. The fourth transistor has a first end coupled to the second end of the third transistor, a second end for receiving the second low voltage, and a control end for receiving the second gate reference signal.

According to the above description of the shift register of the present embodiment, the discharge path of the terminal voltage is a dual gate structure, and an intermediate voltage level is applied between the cascaded transistors, thereby lowering the leakage current from transistors.

In a further aspect of the present invention, a liquid crystal display (LCD) panel is provided. In certain embodiments, the LCD panel includes a glass substrate, and a shift register as disclosed above, which is disposed on the glass substrate.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION OF THE DISCLOSURE

Figure 1:
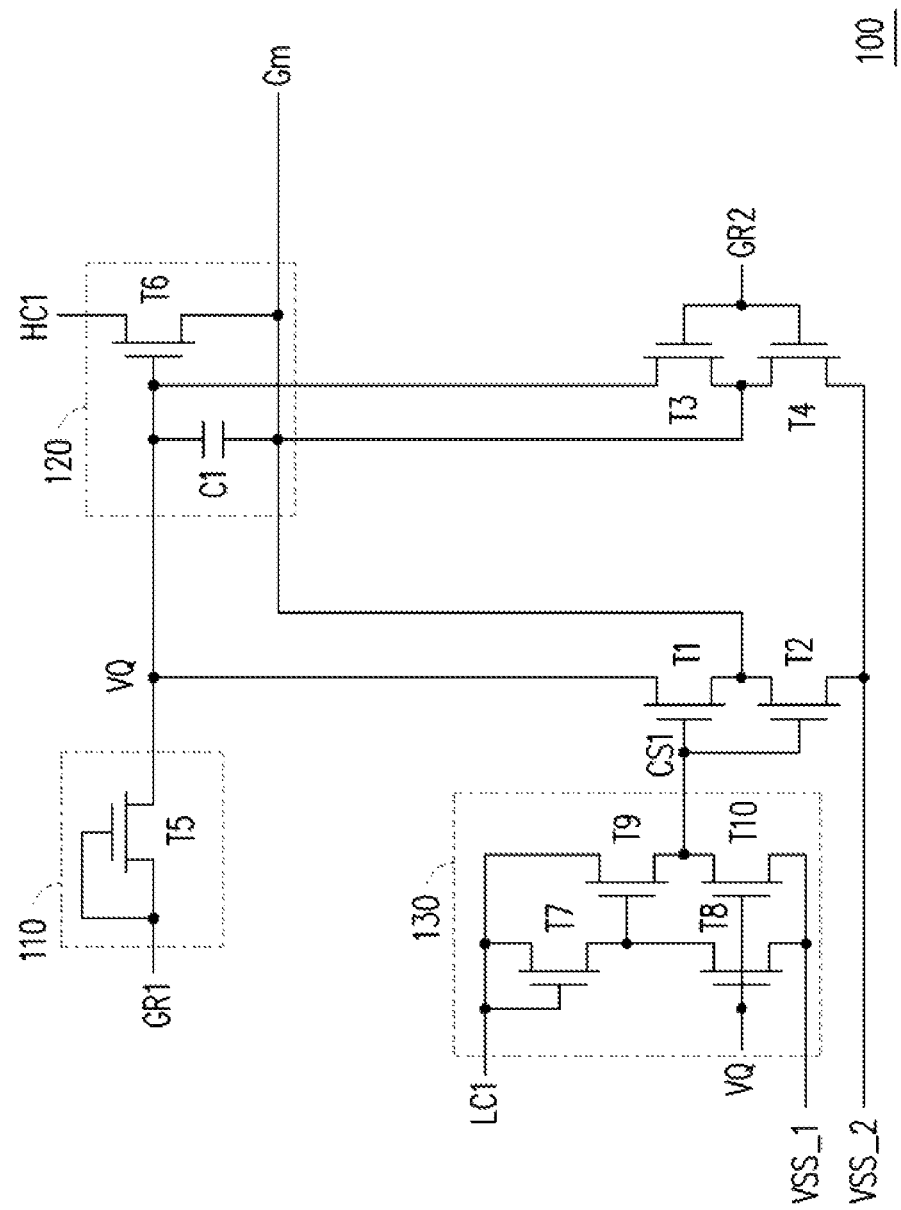
FIG. 1 is a schematic diagram of a circuit of a shift register according to a first embodiment of the present invention.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

FIG. 1 is a schematic diagram of a circuit of a shift register according to a first embodiment of the present invention. Referring to FIG. 1, a shift register 100 of the present embodiment includes a voltage setting unit 110, a first control unit 130 and transistors T1-T4 (corresponding to the first transistor to fourth transistor of the instant disclosure). In certain embodiments, the transistors T1-T4 may be Indium-Gallium-Zinc Oxide (IGZO) thin film transistors, but the embodiments of the present invention are not limited thereto.

The voltage setting unit 110 receives a first gate reference signal GR1 so as to provide a terminal voltage VQ. In certain embodiments, a voltage level of the terminal voltage VQ is set according to the first gate reference signal GR1. The drive unit 120 receives the terminal voltage VQ and a clock signal HC1, so as to provide a main gate signal Gm according to the terminal voltage VQ and the clock signal HC1. For example, when the terminal voltage VQ and the clock signal HC1 are both at high voltage levels, an enabled main gate signal Gm is provided; namely the voltage level of the main gate signal Gm is increased. When the terminal voltage VQ is at a low voltage level, the voltage level of the main gate signal Gm is not increased regardless of whether the clock signal HC1 is at a high voltage level or a low voltage level.

The first control unit 130 receives a first latch reference signal LC1, the terminal voltage VQ and a first low voltage VSS_1, so as to provide a first control signal CS1. For example, when the terminal voltage VQ is at a low voltage level, the first control unit 130 enables the first control signal CS1; namely the voltage level of the first control signal CS1 is increased. When the terminal voltage VQ is at a low voltage level, the first control unit 130 disables the first control signal CS1, namely lowering the voltage level of the first control signal CS1. The first latch reference signal LC1 may be at a fixed voltage level, such as a gate high voltage VGH, or may be a clock signal such as the clock signal HC1, but the embodiments of the present invention are not limited thereto.

Each of the transistors T1-T4 has a drain, a source, and a gate. The drain (corresponding to the first end) of the transistor T1 (corresponding to the first transistor of the instant disclosure) receives the terminal voltage VQ, the source (corresponding to the second end) of the transistor T1 receives a level reference signal, and the gate (corresponding to the control end) of the transistor T1 receives the first control signal CS1. The drain (corresponding to the first end) of the transistor T2 (corresponding to the second transistor of the instant disclosure) is coupled to the source of the transistor T1, the source (corresponding to the second end) of the transistor T2 receives a second low voltage VSS_2, and the gate (corresponding to the control end) of the transistor T2 receives the first control signal CS1. The voltage level of the level reference signal is set to be less than or equal to the terminal voltage VQ and greater than the second low voltage VSS_2, as presently exemplified by the main gate signal Gm, but the embodiments of the present invention are not limited thereto. Furthermore, the second low voltage VSS_2 may be less than or equal to the first low voltage VSS_1. For example, the first low voltage VSS_1 is −6 volts, and the second low voltage VSS_2 may be −6 or −8 volts, which may be determined by a person of ordinary skill in the art, and the embodiments of the present invention are not limited thereto.

The drain (corresponding to the first end) of the transistor T3 (corresponding to the third transistor of the instant disclosure) receives the terminal voltage VQ, the source (corresponding to the second end) of the transistor T3 receives the main gate signal Gm (i.e. the level reference signal), and the gate (corresponding to the control end) of the transistor T3 receives a second gate reference signal GR2. The drain (corresponding to the first end) of the transistor T4 (corresponding to the fourth transistor of the instant disclosure) is coupled to the source of the transistor T3, the source (corresponding to the second end) of the transistor T4 receives the second low voltage VSS_2, and the gate (corresponding to the control end) of the transistor T4 receives the second gate reference signal GR2.

According to the above descriptions, the discharge path of the terminal voltage VQ of the shift register 100 is a dual gate structure, namely constructed by two cascaded transistors, and an intermediate voltage level is applied between the cascaded transistors, thereby lowering the leakage current from transistors.

In the present embodiment, the enable time of the first gate reference signal GR1 is earlier than the enable time of the main gate signal Gm, and the enable time of the main gate signal Gm is earlier than the enable time of the second gate reference signal GR2. For example, the first gate reference signal GR1 may be the main gate signal Gm or a gate initial signal provided by an N-stage-before shift register, and the second gate reference signal GR2 may be the main gate signal Gm provided by an N-stage-after shift register, wherein N is a positive integer greater than or equal to 1. In certain embodiments, the value of N is determined according to circuit design.

In certain embodiments, the voltage setting unit 110 includes a transistor T5 (corresponding to the sixteenth transistor of the instant disclosure). The drain (corresponding to the first end) of the transistor T5 receives the first gate reference signal GR1, the source (corresponding to the second end) of the transistor T5 provides the terminal voltage VQ, and the gate (corresponding to the control end) of the transistor T5 receives the first gate reference signal GR1.

In certain embodiments, the drive unit 120 includes a first capacitor C1 and a transistor T6 (corresponding to the sixth transistor of the instant disclosure). The transistor T6 may be an IGZO thin film transistor. The drain (corresponding to the first end) of the transistor T6 receives the clock signal HC1, the source (corresponding to the second end) of the transistor T6 provides the main gate signal Gm, and the gate (corresponding to the control end) of the transistor T6 receives the terminal voltage VQ. The first capacitor C1 is coupled between the gate and the source of the transistor T6.

In certain embodiments, the first control unit 130 includes transistors T7 to T10 (corresponding to the seventh transistor to the tenth transistor of the instant disclosure). The transistors T7 to T10 may be IGZO thin film transistors, but the embodiments of the present invention are not limited thereto. The drain (corresponding to the first end) of the transistor T7 (corresponding to the seventh transistor of the instant disclosure) receives the first latch reference signal LC1, and the gate (corresponding to the control end) of the transistor T7 is coupled to the drain of the transistor T7. The drain (corresponding to the first end) of the transistor T8 (corresponding to the eighth transistor) is coupled to the source (corresponding to the second end) of the transistor T7, the source (corresponding to the second end) of the transistor T8 receives the first low voltage VSS_1, and the gate (corresponding to the control end) of the transistor T8 receives the terminal voltage VQ.

The drain (corresponding to the first end) of the transistor T9 (corresponding to the ninth transistor of the instant disclosure) receives the first latch reference signal LC1, the source (corresponding to the second end) of the transistor T9 provides the first control signal CS1, and the gate (corresponding to the control end) of the transistor T9 is coupled to the source of the transistor T7. The drain (corresponding to the first end) of the transistor T10 (corresponding to the tenth transistor of the instant disclosure) is coupled to the source of the transistor T9, the source (corresponding to the second end) of the transistor T10 receives the first low voltage VSS_1, and the gate (corresponding to the control end) of the transistor T10 receives the terminal voltage VQ.

Figure 2:
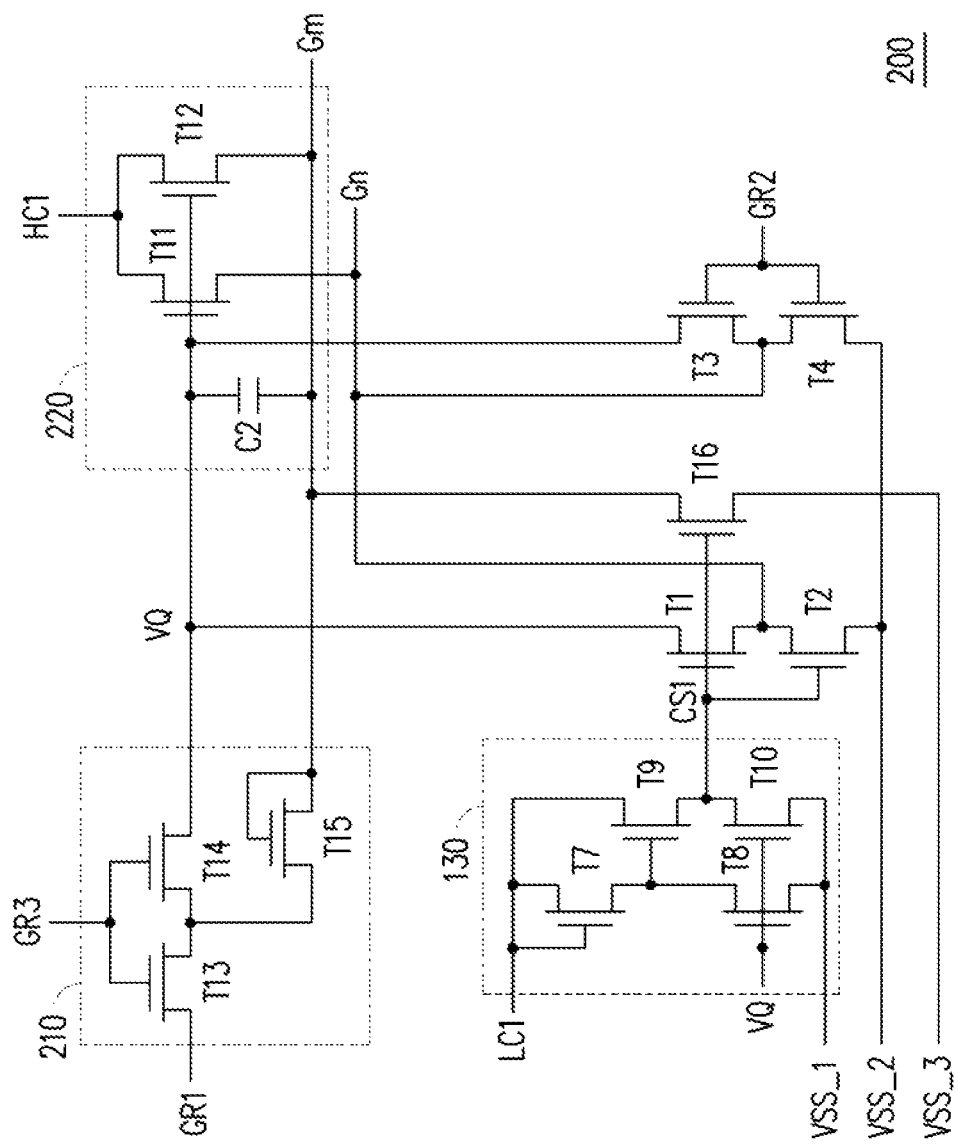
FIG. 2 is a schematic diagram of a circuit of a shift register according to a second embodiment of the present invention.

FIG. 2 is a schematic diagram of a circuit of a shift register according to a second embodiment of the present invention. Referring to FIGS. 1 and 2, a shift register 200 is generally similar to the shift register 100. The difference lies in a voltage setting unit 210, a drive unit 220 and a transistor T16 (corresponding to the fifth transistor of the instant disclosure) of the shift register 200, and the sources of the transistors T1 and T3 receive a secondary gate signal Gn (i.e. the level reference signal). The fifth transistor T16 may be an IGZO thin film transistor.

The voltage setting unit 210 receives the first gate reference signal GR1, a third gate reference signal GR3 and the main gate signal Gm, so as to provide the terminal voltage VQ. The drive unit 220 receives the terminal voltage VQ and the clock signal HC1, so as to provide the main gate signal Gm and the secondary gate signal Gn according to the terminal voltage VQ and the clock signal HC1. The enable times of the main gate signal Gm and the secondary signal Gn completely overlap, and the enable times of the first gate reference signal GR1 and the third gate reference signal GR3 completely overlap; namely, the third gate reference signal GR3 may be the main gate signal Gm or the secondary gate signal Gn provided by an N-stage-before shift register, as may be determined by a person of ordinary skill in the art.

The drain (corresponding to the first end) of the fifth transistor T16 receives the main gate signal Gm, the source (corresponding to the second end) of the fifth transistor T16 receives a third low voltage VSS_3, and the gate (corresponding to the third end) of the fifth transistor T16 receives the first control signal CS1, wherein the first low voltage VSS_1 is higher than the second low voltage VSS_2, and the second low voltage VSS_2 is higher than the third low voltage VSS_3. For example, the first low voltage VSS_1, the second low voltage VSS_2 and the third low voltage VSS_3 may be −6, −8 and −10 volts, respectively, but the embodiments of the present invention are not limited thereto.

According to the above descriptions, by providing a number of low voltages at various voltage levels, operation of some of the transistors at a negative threshold voltage may be avoided, thereby preventing false actions of the shift register 200.

In the present embodiment, the drive unit 220 includes a second capacitor C2 and transistors T11, T12 (corresponding to the eleventh and twelfth transistors of the instant disclosure), and the transistors T11, T12 may be IGZO thin film transistors. The drain (corresponding to the first end) of the transistor T11 (corresponding to the eleventh transistor of the instant disclosure) receives the clock signal HC1, the source (corresponding to the second end) of the transistor T11 provides the secondary gate signal Gn, and the gate (corresponding to the control end) of the transistor T11 receives the terminal voltage VQ. The drain (corresponding to the first end) of the transistor T12 (corresponding to the twelfth transistor of the instant disclosure) receives the clock signal HC1, the source (corresponding to the second end) of the transistor T12 provides the main gate signal Gm, and the gate (corresponding to the control end) of the transistor T12 receives the terminal voltage VQ. The second capacitor C2 is coupled between the gate and the source of the transistor T12.

The voltage setting unit 210 includes transistors T13 to T15 (corresponding to the thirteenth transistor to fifteenth transistor of the instant disclosure), and the transistors T13 to T15 may be IGZO thin film transistors. The drain (corresponding to the first end) of the transistor T13 (corresponding to the thirteenth transistor) receives the first gate reference signal GR1, and the gate (corresponding to the control end) of the transistor T13 receives the third reference signal GR3. The drain (corresponding to the first end) of the transistor T14 (corresponding to the fourteenth transistor) is coupled to the source (corresponding to the second end) of the transistor T13, the source (corresponding to the second end) of the transistor T14 provides the terminal voltage VQ, and the gate (corresponding to the control end) of the transistor T14 receives the third reference signal GR3. The source (corresponding to the first end) of the transistor T15 (corresponding to fifteenth transistor) is coupled to the source of the transistor T13, the drain (corresponding to the second end) of the transistor T15 receives the main gate signal Gm, and the gate (corresponding to the control end) of the transistor T15 receives the main gate signal Gm.

According to the above, when the first gate reference signal GR1 and the third gate reference signal GR3 are enabled, the transistors T13 and T14 are turned on and set the terminal voltage VQ through the enabled first gate reference signal GR1, but the transistor T15 is reverse biased and turned off, so the enabled first gate reference signal GR1 does not influence the main gate signal Gm. When the first gate reference signal GR1 and the third gate reference signal GR3 are disabled and the main gate signal Gm is enabled, the transistor T15 is forward biased, so as to apply an intermediate voltage level between the cascaded transistors T13, T14.

Figure 3:
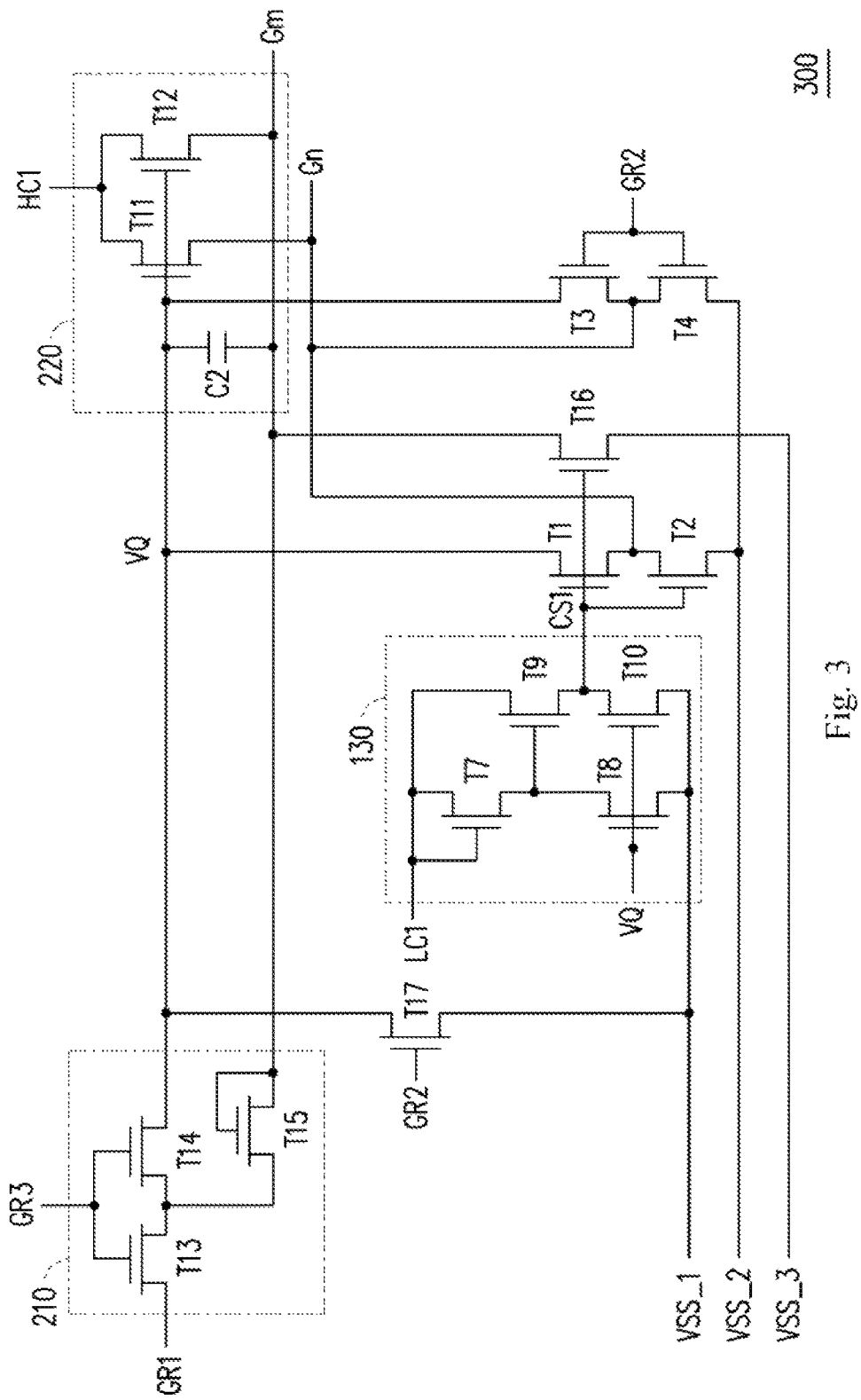
FIG. 3 is a schematic diagram of a circuit of a shift register according to a third embodiment of the present invention.

FIG. 3 is a schematic diagram of a circuit of a shift register according to a third embodiment of the present invention. Referring to FIGS. 2 and 3, the shift register 300 is generally similar to the shift register 200. The difference lies in a transistor T17 (corresponding to the seventeenth transistor of the instant disclosure) of the shift register 300, and the transistor T17 may be an IGZO thin film transistor. The drain (corresponding to the first end) of the transistor T17 receives the terminal voltage VQ, the source (corresponding to the second end) of the transistor T17 receives the first low voltage VSS_1, and the gate (corresponding to the control end) of the transistor T17 receives the second gate reference signal GR2.

Figure 4:
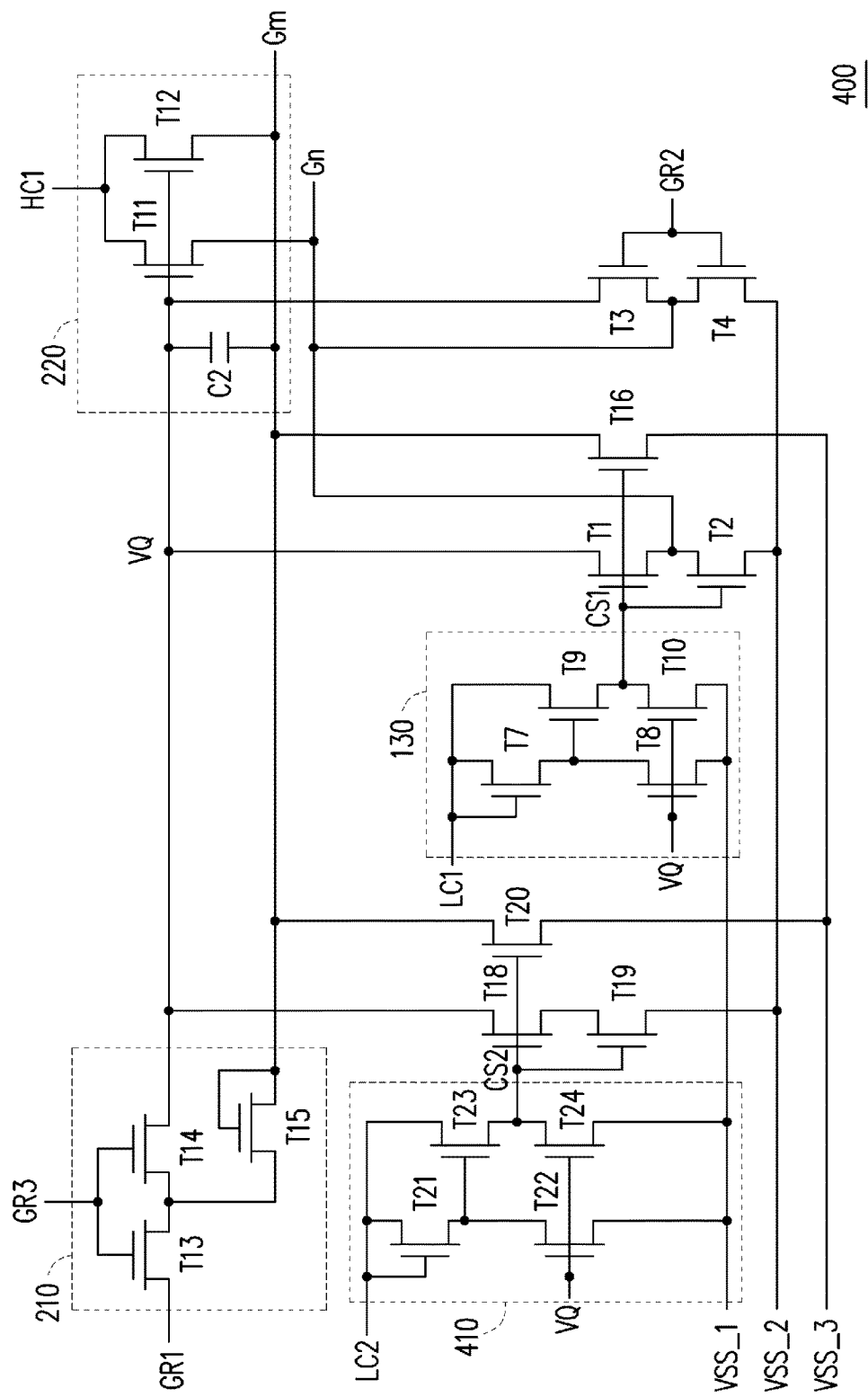
FIG. 4 is a schematic diagram of a circuit of a shift register according to a fourth embodiment of the present invention.

FIG. 4 is a schematic diagram of a circuit of a shift register according to a fourth embodiment of the present invention. Referring to FIGS. 2 and 4, the shift register 400 is generally similar to the shift register 200. The differences lie in a second control unit 410 and transistors T18 to T20 (corresponding to the eighteenth transistor to the twentieth transistor of the instant disclosure) of the shift register 400, wherein the circuit operation of the second control unit 410 is generally similar to that of the first control unit 130, and the transistors T18 to T20 may be IGZO thin film transistors. The second control unit 410 receives the second latch reference signal LC2, the terminal voltage VQ and the first low voltage VSS_1 to provide the second control signal CS2, wherein the second latch reference signal LC2 and the first latch reference signal LC1 are inverted with respect to each other.

The drain (corresponding to the first end) of the transistor T18 (corresponding to the eighteenth transistor of the instant disclosure) receives the terminal voltage VQ, the source (corresponding to the second end) of the transistor T18 receives the secondary gate signal Gn (i.e. the level reference signal), and the gate (corresponding to the control end) of the transistor T18 receives the second control signal CS2. The drain (corresponding to the first end) of the transistor T19 (corresponding to the nineteenth transistor of the instant disclosure) is coupled to the source of the transistor T18, the source (corresponding to the second end) of the transistor T19 receives the second low voltage VSS_2, and the gate (corresponding to the control end) of the transistor T19 receives the second control signal CS2. The drain (corresponding to the first end) of the transistor T20 (corresponding to the twentieth transistor of the instant disclosure) receives the main gate signal Gm, the source (corresponding to the second end) of the transistor T20 receives the third low voltage VSS_3, and the gate (corresponding to the third end) of the transistor T20 receives the second control voltage CS2.

The second control unit 410 includes transistors T21 to T24 (corresponding to the twenty-first transistor to the twenty-fourth transistor of the instant disclosure), and the transistors T21 to T24 may be IGZO thin film transistors. The drain (corresponding to the first end) of the transistor T21 (corresponding to the twenty-first transistor of the instant disclosure) receives the latch reference signal LC2, and the gate (corresponding to the control end) of the transistor T21 is coupled to the drain of the transistor T21. The drain (corresponding to the first end) of the transistor T22 (corresponding to the twenty-second transistor of the instant disclosure) is coupled to the source (corresponding to the second end) of the transistor T21, the source (corresponding to the second end) of the transistor T21 receives the first low voltage VSS_1, and the gate (corresponding to the control end) of the transistor T21 receives the terminal voltage VQ.

The drain (corresponding to the first end) of the transistor T23 (corresponding to the twenty-third transistor of the instant disclosure) receives the second latch reference signal LC2, the source (corresponding to the second end) of the transistor T23 provides the second control signal CS2, and the gate (corresponding to the control end) of the transistor T23 is coupled to the source of the transistor T21. The drain (corresponding to the first end) of the transistor T24 (corresponding to the twenty-fourth transistor of the instant disclosure) is coupled to the source of the transistor T23, the source (corresponding to the second end) of the transistor T24 receives the first low voltage VSS_1, and the gate (corresponding to the control end) of the transistor T24 receives the terminal voltage VQ.

According to the above descriptions, the shift register 400 has two sets of alternating discharge circuits to suppress the Positive Bias Temperature Stress (PBTS).

In summary, the discharge path for the terminal voltage of the shift registers of the embodiments of the present invention is a dual gate structure, and an intermediate voltage level is applied between cascaded transistors, thereby reducing the leakage current from transistors. Furthermore, by providing a number of low voltages at various voltage levels, operation of some of the transistors at a negative threshold voltage is avoided, thereby preventing false actions of the shift register. Moreover, the shift register has two sets of alternating discharge circuits to suppress the Positive Bias Temperature Stress (PBTS).

In a further aspect, a LCD panel may be provided. The LCD panel may include a glass substrate and a shift register disposed on the glass substrate. In certain embodiments, the shift register may be any shift register as disclosed above.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A shift register, comprising:
   a voltage setting unit configured to receive a first gate reference signal so as to provide a terminal voltage;
   a drive unit configured to receive the terminal voltage and a clock signal, so as to provide a main gate signal and a secondary gate signal according to the terminal voltage and the clock signal;
   a first control unit configured to receive a first latch reference signal, the terminal voltage and a first low voltage, so as to provide a first control signal, wherein the first latch reference signal is a gate high voltage;
   a first transistor having a first end configured to receive the terminal voltage, a second end configured to receive a level reference signal, and a control end configured to receive the first control signal, wherein the level reference signal is the secondary gate signal;
   a second transistor having a first end coupled to the second end of the first transistor, a second end configured to receive a second low voltage, and a control end configured to receive the first control signal, wherein the first low voltage is higher than the second low voltage;
   a third transistor having a first end configured to receive the terminal voltage, a second end configured to receive the level reference signal, and a control end configured to receive a second gate reference signal;
   a fourth transistor having a first end coupled to the second end of the third transistor, a second end configured to receive the second low voltage, and a control end configured to receive the second gate reference signal; and
   a fifth transistor having a first end configured to receive the main gate signal, a second end configured to receive a third low voltage, and a control end configured to receive the first control signal, wherein the second low voltage is higher than the third low voltage.

2. The shift register according to claim 1, wherein an enable time of the first gate reference signal is earlier than an enable time of the main gate signal, and the enable time of the main gate signal is earlier than an enable time of the second gate reference signal.

3. The shift register according to claim 1, wherein the first control unit comprises:
   a seventh transistor having a first end configured to receive the first latch reference signal, a second end, and a control end coupled to the first end of the seventh transistor;
   an eighth transistor having a first end coupled to the second end of the seventh transistor, a second end configured to receive the first low voltage, and a control end configured to receive the terminal voltage;
   a ninth transistor having a first end configured to receive the first latch reference signal, a second end configured to provide the first control signal, and a control end coupled to the second end of the seventh transistor; and
   a tenth transistor having a first end coupled to the second end of the ninth transistor, a second end configured to receive the first low voltage, and a control end configured to receive the terminal voltage.

4. The shift register according to claim 1, wherein the drive unit comprises:
   an eleventh transistor having a first end configured to receive the clock signal, a second end configured to provide the secondary gate signal, and a control end configured to receive the terminal voltage;
   a twelfth transistor having a first end configured to receive the clock signal, a second end configured to provide the main gate signal, and a control end configured to receive the terminal voltage; and
   a second capacitor coupled between the control end of the twelfth transistor and the second end of the twelfth transistor.

5. The shift register according to claim 1, wherein the voltage setting unit receives the first gate reference signal, a third gate reference signal and the main gate signal so as to provide the terminal voltage, wherein enable times of the first gate reference signal and the third gate reference signal completely overlap.

6. The shift register according to claim 5, wherein the voltage setting unit comprises:
   a thirteenth transistor having a first end configured to receive the first gate reference signal, a second end, and a control end configured to receive the third gate reference signal;
   a fourteenth transistor having a first end coupled to the second end of the thirteenth transistor, a second end configured to provide the terminal voltage, and a control end configured to receive the third gate reference signal; and
   a fifteenth transistor having a first end coupled to the second end of the thirteenth transistor, a second end configured to receive the main gate signal, and a control end configured to receive the main gate signal.

7. The shift register according to claim 1, further comprising:
   a seventeenth transistor having a first end configured to receive the terminal voltage, a second end configured to receive the first low voltage, and a control end configured to receive the second gate reference signal.

8. The shift register according to claim 1, further comprising:
   a second control unit configured to receive a second latch reference signal, the terminal voltage and the first low voltage, so as to provide a second control signal, wherein the second latch reference signal and the first latch reference signal are inverted with respect to each other;

an eighteenth transistor having a first end configured to receive the terminal voltage, a second end configured to receive the secondary gate signal, and a control end configured to receive the second control signal;

a nineteenth transistor having a first end coupled to the second end of the eighteenth transistor, a second end configured to receive the second low voltage, and a control end configured to receive the second control signal; and a twentieth transistor having a first end configured to receive the main gate signal, a second end configured to receive the third low voltage, and a control end configured to receive the second control signal.

9. The shift register according to claim 8, wherein the second control unit comprises:

a twenty-first transistor having a first end configured to receive the second latch reference signal, a second end, and a control end coupled to the first end of the twenty-first transistor;

a twenty-second transistor having a first end coupled to the second end of the twenty-first transistor, a second end configured to receive the first low voltage, and a control end configured to receive the terminal voltage;

a twenty-third transistor having a first end configured to receive the second latch reference signal, a second end configured to provide the second control signal, and a control end coupled to the second end of the twenty-first transistor; and a twenty-fourth transistor having a first end coupled to the second end of the twenty-third transistor, a second end configured to receive the first low voltage, and a control end configured to receive the terminal voltage.

10. A liquid crystal display (LCD) panel, comprising:
a glass substrate; and
a shift register disposed on the glass substrate, the shift register comprising:
  a voltage setting unit configured to receive a first gate reference signal so as to provide a terminal voltage;
  a drive unit configured to receive the terminal voltage and a clock signal, so as to provide a main gate signal and a secondary gate signal according to the terminal voltage and the clock signal;
  a first control unit configured to receive a first latch reference signal, the terminal voltage and a first low voltage, so as to provide a first control signal, wherein the first latch reference signal is a gate high voltage;
  a first transistor having a first end configured to receive the terminal voltage, a second end configured to receive a level reference signal, and a control end configured to receive the first control signal, wherein the level reference signal is the secondary gate signal;
  a second transistor having a first end coupled to the second end of the first transistor, a second end configured to receive a second low voltage, and a control end configured to receive the first control signal, wherein the first low voltage is higher than the second low voltage;
  a third transistor having a first end configured to receive the terminal voltage, a second end configured to receive the level reference signal, and a control end configured to receive a second gate reference signal;

a fourth transistor having a first end coupled to the second end of the third transistor, a second end configured to receive the second low voltage, and a control end configured to receive the second gate reference signal; and a fifth transistor having a first end configured to receive the main gate signal, a second end configured to receive a third low voltage, and a control end configured to receive the first control signal, wherein the second low voltage is higher than the third low voltage.

11. The LCD panel according to claim 10, wherein the first control unit comprises:

a seventh transistor having a first end configured to receive the first latch reference signal, a second end, and a control end coupled to the first end of the seventh transistor;

an eighth transistor having a first end coupled to the second end of the seventh transistor, a second end configured to receive the first low voltage, and a control end configured to receive the terminal voltage;

a ninth transistor having a first end configured to receive the first latch reference signal, a second end configured to provide the first control signal, and a control end coupled to the second end of the seventh transistor; and a tenth transistor having a first end coupled to the second end of the ninth transistor, a second end configured to receive the first low voltage, and a control end configured to receive the terminal voltage.

12. The LCD panel according to claim 10, wherein the drive unit comprises:

an eleventh transistor having a first end configured to receive the clock signal, a second end configured to provide the secondary gate signal, and a control end configured to receive the terminal voltage;

a twelfth transistor having a first end configured to receive the clock signal, a second end configured to provide the main gate signal, and a control end configured to receive the terminal voltage; and a second capacitor coupled between the control end of the twelfth transistor and the second end of the twelfth transistor.

13. The LCD panel according to claim 10, wherein the voltage setting unit receives the first gate reference signal, a third gate reference signal and the main gate signal so as to provide the terminal voltage, wherein enable times of the first gate reference signal and the third gate reference signal completely overlap.

14. The LCD panel according to claim 13, wherein the voltage setting unit comprises:

a thirteenth transistor having a first end configured to receive the first gate reference signal, a second end, and a control end configured to receive the third gate reference signal;

a fourteenth transistor having a first end coupled to the second end of the thirteenth transistor, a second end configured to provide the terminal voltage, and a control end configured to receive the third gate reference signal; and a fifteenth transistor having a first end coupled to the second end of the thirteenth transistor, a second end configured to receive the main gate signal, and a control end configured to receive the main gate signal.

15. The LCD panel according to claim 10, wherein the shift register further comprises:

a seventeenth transistor having a first end configured to receive the terminal voltage, a second end configured to receive the first low voltage, and a control end configured to receive the second gate reference signal.

16. The LCD panel according to claim 10, wherein the shift register further comprises:
    a second control unit configured to receive a second latch reference signal, the terminal voltage and the first low voltage, so as to provide a second control signal, wherein the second latch reference signal and the first latch reference signal are inverted with respect to each other;
    an eighteenth transistor having a first end configured to receive the terminal voltage, a second end configured to receive the secondary gate signal, and a control end configured to receive the second control signal;
    a nineteenth transistor having a first end coupled to the second end of the eighteenth transistor, a second end configured to receive the second low voltage, and a control end configured to receive the second control signal; and
    a twentieth transistor having a first end configured to receive the main gate signal, a second end configured to receive the third low voltage, and a control end configured to receive the second control signal.

17. The LCD panel according to claim 16, wherein the second control unit comprises:
    a twenty-first transistor having a first end configured to receive the second latch reference signal, a second end, and a control end coupled to the first end of the twenty-first transistor;
    a twenty-second transistor having a first end coupled to the second end of the twenty-first transistor, a second end configured to receive the first low voltage, and a control end configured to receive the terminal voltage;
    a twenty-third transistor having a first end configured to receive the second latch reference signal, a second end configured to provide the second control signal, and a control end coupled to the second end of the twenty-first transistor; and
    a twenty-fourth transistor having a first end coupled to the second end of the twenty-third transistor, a second end configured to receive the first low voltage, and a control end configured to receive the terminal voltage.

* * * * *